United States Patent
Chen et al.

(10) Patent No.: US 7,863,731 B2
(45) Date of Patent: Jan. 4, 2011

(54) HEAT-DISSIPATING STRUCTURE AND HEAT-DISSIPATING SEMICONDUCTOR PACKAGE HAVING THE SAME

(75) Inventors: Chin-Te Chen, Taichung Hsien (TW); Ke-Chuan Yang, Taichung Hsien (TW); Chang-Fu Lin, Taiwan (CN)

(73) Assignee: Siliconware Precision Industries Co., Ltd., Taichung (TW)

( * ) Notice: Subject to any disclaimer, the term of this patent is extended or adjusted under 35 U.S.C. 154(b) by 315 days.

(21) Appl. No.: 12/001,612

(22) Filed: Dec. 11, 2007

(65) Prior Publication Data

US 2008/0142955 A1    Jun. 19, 2008

(30) Foreign Application Priority Data

Dec. 13, 2006   (TW) .............. 95146576 A

(51) Int. Cl.
*H01L 23/10* (2006.01)
(52) U.S. Cl. ............. 257/706; 257/707; 257/713; 257/719; 257/E23.051; 257/E23.08
(58) Field of Classification Search ......... 257/276, 257/625, 675, 706, 707, 712–796, E33.075, 257/E31.131, E23.051, E23.08–E23.113; 361/709–712, 679.47, 679.54, 697, 702; 174/548, 563
See application file for complete search history.

(56) References Cited

U.S. PATENT DOCUMENTS

| 5,378,924 A | * | 1/1995 | Liang | ............... 257/675 |
|---|---|---|---|---|
| 6,380,621 B1 | | 4/2002 | Ando et al. | |
| 6,504,242 B1 | | 1/2003 | Deppisch et al. | |
| 6,504,723 B1 | | 1/2003 | Fitzgerald et al. | |

FOREIGN PATENT DOCUMENTS

| DE | 195 19 549 | * | 5/1995 | |
| JP | 63-293928 | * | 11/1988 | ............ 257/676 |

\* cited by examiner

*Primary Examiner*—Jasmine J Clark
(74) *Attorney, Agent, or Firm*—Peter F. Corless; Steven M. Jensen; Edwards Angell Palmer & Dodge LLP

(57) ABSTRACT

A heat-dissipating structure and a heat-dissipating semiconductor package having the same are disclosed in the present invention. The heat-dissipating semiconductor package includes a chip carrier, a flip chip semiconductor chip attached and electrically connected to the chip carrier, and a heat sink bonded to the flip chip semiconductor chip via a thermal interface material, such as a solder material, wherein a groove is formed on the heat sink around the bonding area of the thermal interface material, and a blocking layer, such as a metal oxide layer, is formed on the surface of the groove to reduce the wetting capability of the thermal interface material, thus further prevents the thermal interface material from wetting the groove in the fusion process performed the thermal interface material, therefore, it ensures the thermal interface material has sufficient thickness for forming solder bonding between the heat sink and the flip chip semiconductor chip.

15 Claims, 4 Drawing Sheets

HEAT-DISSIPATING STRUCTURE AND HEAT-DISSIPATING SEMICONDUCTOR PACKAGE HAVING THE SAME

BACKGROUND OF THE INVENTION

1. Field of the Invention

This invention generally relates to a semiconductor package, and more specifically, to a heat-dissipating structure and a heat-dissipating semiconductor package having the heat-dissipating structure.

2. Description of Related Art

A flip chip ball grid array (FCBGA) semiconductor package is a package structure that has a flip chip and a ball grid array for an active surface of a semiconductor chip to be electrically connected to one surface of a substrate via a plurality of conductive bumps, and also has a plurality of solder balls that serve as input/output terminals formed on the other surface of the substrate. Such package structure has significantly reduced package size, and eliminates the conventional wire design, thereby reducing impedance and enhancing electrical performance to avoid signal failing during the transmission process. Therefore, the FCBGA semiconductor package has become the main stream of the next generation packaging technology of the chips and the electronic elements.

Due to the advantageous features, the flip chip ball grid array package is mostly applied in the electronic elements of high integration to provide the desired package size and electrical performance for the electronic elements. However, such electronic elements produce more heat than general packages in the operation process due to high frequency of operation. Hence, the heat dissipation efficiency is an important key that affects the quality and the yield of the packaging technology.

In the conventional flip chip ball grid array semiconductor package, a heat sink is directly bonded to the non-active surface of the chip without encapsulant filled between the non-active surface and heat sink which has poor heat conductivity, so as to achieve a better heat dissipation efficiency.

Generally, the bonding material used for bonding the heat sink to the non-active surface of the flip chip semiconductor chip is epoxy-based, and has the heat conductivity coefficient of 2~4 w/m° K. However, compared with the heat sink that has heat conductivity coefficient of hundreds w/m° K (for example, the heat conductivity coefficient of copper is 400 w/m° K), the epoxy-based bonding material can not dissipate heat effectively. Therefore, along with the demands of the electronic products or the semiconductor package elements for heat dissipation getting higher, it must be a trend to apply a higher heat conductivity coefficient bonding material for providing a better heat dissipation between the heat sink and the chip.

In view of the aforementioned reasons, U.S. Pat. Nos. 6,504,242, 6,380,621, and 6,504,723 use a tin-based (Sn-based) solder material as a thermal interface material (TIM) that bonds the heat sink and the flip chip semiconductor chip together. Since the solder material has the metal component, its heat conductivity coefficient is about 50 w/m° K, and if it is made of pure tin, its heat conductivity coefficient can be up to 86 w/m° K. Compared with the conventional epoxy-based bonding material, the Sn-based solder material has much higher heat conductivity capability, and therefore it is more capable of fitting the demands for heat dissipation.

Please refer to FIG. 1. However, such thermal interface material made of solder material 15 has great wetting capability with the heat sink 13 that is generally made of copper, such that as soon as the fusion process starts, the solder material 15 diffuses quickly on the heat sink 13. Thus the thickness formed is not sufficient to form a solder bonding between the heat sink 13 and the flip chip semiconductor chip 12; meanwhile, the bonding area between the solder material 15 and the flip chip semiconductor chip 12 is also reduced, thus causes breakage of solder material therebetween and affects heat dissipation efficiency and product reliability.

Please refer to FIG. 2, which is a cross-section view showing a flip chip semiconductor chip disclosed in U.S. Pat. No. 6,380,621. The metal layers 24 made of, for example nickel (Ni) or gold (Au), are preformed on the surface of the heat sink 23 and the non-active surface of the flip chip semiconductor chip 22, such that when the fusion process is performed on a thermal interface material, such as a solder material 25, the solder material 25 can have solder bonding with the metal layers 24, and thus limits the wetting area. However, this technique requires preforming separate metal layers of nickel (Ni) or gold (Au) on the surface of the heat sink and the non-active surface of the flip chip semiconductor chip, and therefore the fabrication process is complicated and the product cost is high as well.

Please refer to FIG. 3A and FIG. 3B, which are cross-section views showing a flip chip semiconductor chip disclosed in U.S. Pat. No. 6,504,723. A heat dissipation structure 33 is provided, and the heat dissipation structure 33 includes a raised section 331 that protrudes downward from the center of the heat dissipation structure 33 and then shrinks gradually, and an extension section 332 that extends downward from each side of the heat dissipation structure 33. The center raised section 331 has a flat bottom and four sloping surfaces, the surfaces of the raised section 331 has been preapplied with soldering flux 36, and then the heat dissipation structure 33 is pressed down via a bonding material 37 to a substrate 31 that has a flip chip semiconductor chip 32 mounted thereon. The raised section 331 of the heat dissipation structure 33 is pressed to the solder material 35 that is preapplied on the non-active surface of the flip chip semiconductor chip 32, and the fusion process is performed on the solder material 35, such that the solder material 35 disperses in the gap between the raised section 331 of the heat dissipation structure 33 and the flip chip semiconductor chip 32, and the solder material 35 is held by the sloping surfaces of the raised section 331 so as to restrict the flow thereof.

However, the heat-dissipating structure of U.S. Pat. No. 6,504,723 is too complicated and also has high production cost, it does not answer to the practical application and the economic consideration.

Hence, it is a highly urgent issue in the industry for how to provide a technique that has simple application and low production cost and is capable of restricting the solder thermal interface material to the wetting area between the heat sink and the semiconductor chip in order to prevent it from improper overflowing, meanwhile the technique is also capable of avoiding using a complicated heat-dissipating structure and eliminating the need of preapplying metal layers on the heat sink and the semiconductor chip, thereby giving the benefits of saving fabrication time and production cost.

SUMMARY OF THE INVENTION

In view of the aforementioned disadvantages of the prior art, it is a primary objective of the present invention to provide a heat-dissipating structure and a semiconductor package having the heat-dissipating structure, which are capable of restricting solder thermal interface material to the wetting area between a heat sink and a semiconductor chip.

It is another objective of the present invention to provide a heat-dissipating structure and a semiconductor package having the heat-dissipating structure, which are capable of ensuring the thermal interface material having sufficient thickness to form solder bonding with the semiconductor chip and the heat sink.

It is a further objective of the present invention to provide a heat-dissipating structure and a semiconductor package having the heat-dissipating structure, which eliminate using a complicated heat-dissipating structure and preapplying metal layers on the surfaces of the heat sink and the semiconductor chip, thereby saving fabrication time and production cost.

To achieve the aforementioned and other objectives, a heat-dissipating semiconductor package is disclosed according to the present invention. The heat dissipation semiconductor package includes a chip carrier; a flip chip semiconductor chip mounted on and electrically connected to the chip carrier; a heat sink attached on the flip chip semiconductor chip with a thermal interface material therebetween, wherein the heat sink has a groove formed around the edge of the bonding area of the thermal interface material, a blocking layer is formed on the surface of the groove, wherein the thermal interface material has low wetting effect on the blocking layer on to confine the wetting area of the thermal interface material. The heat sink is made of, for example copper, the thermal interface material is, for example a solder material, the groove can be formed by means of laser grooving, and thus the blocking layer, for example a metal oxide layer (e.g. copper oxide) is also formed on the surface of the groove to lower down the wetting effect of the thermal interface material on the groove, and then further prevent the solder thermal interface material from wetting the groove during the fusion process, thereby ensuring the solder thermal interface material has sufficient thickness for forming solder bonding between the heat sink and the non-active surface of the flip chip semiconductor chip.

The present invention also discloses a heat-dissipating structure, including a heat sink, which has a pre-defined bonding area to be connected to a semiconductor chip, wherein a thermal interface material is positioned between the heat sink and the semiconductor chip; a groove formed around the edge of the bonding area on the heat sink; and a blocking layer formed on the surface of the groove, wherein the thermal interface material has low wetting effect on the blocking layer. The thermal interface material is, for example a solder material, and the blocking layer on the surface of the groove is a metal oxide layer formed on the surface of the groove by means of laser grooving the heat sink that is made of a metal material.

In view of the aforementioned descriptions, the main feature of the heat-dissipating structure and a semiconductor package having the heat-dissipating structure according to the present invention is that the groove is formed on the heat sink and around the edge of the area where the heat sink is bonded to the flip chip semiconductor chip, the blocking layer, for example a metal oxide layer, is formed on the surface of the groove, and the heat sink is attached on the non-active surface of the flip chip semiconductor chip, wherein the thermal interface material is disposed between the heat sink and the non-active surface of the flip chip semiconductor chip. Therefore, in the fusion process performed on the thermal interface material, since the metal oxide layer is formed on the surface of the groove on the heat sink, and the wetting capability of the thermal interface material is lowered down, the thermal interface material will not wet and form onto the groove, thereby ensuring the thermal interface material has sufficient thickness to form solder bonding between the heat sink and the non-active surface of the flip chip semiconductor chip, and further ensuring that the heat sink is bonded to the flip chip semiconductor chip effectively, meanwhile, the heat-dissipating structure and the heat-dissipating semiconductor package having the same according to the present invention do not need to use the conventional complicated heat-dissipating structure and to be preplated with metal layers on the heat sink and the semiconductor chip, thereby saving fabrication time and production cost.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
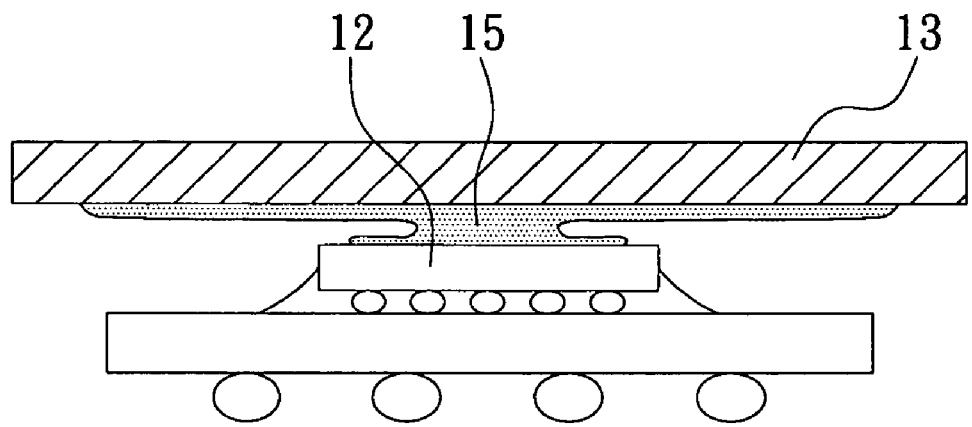
FIG. 1 is a schematic view showing the wet diffusion of a solder thermal interface material that is used to bond a heat sink to a flip chip semiconductor chip according to the prior art.
Figure 2:
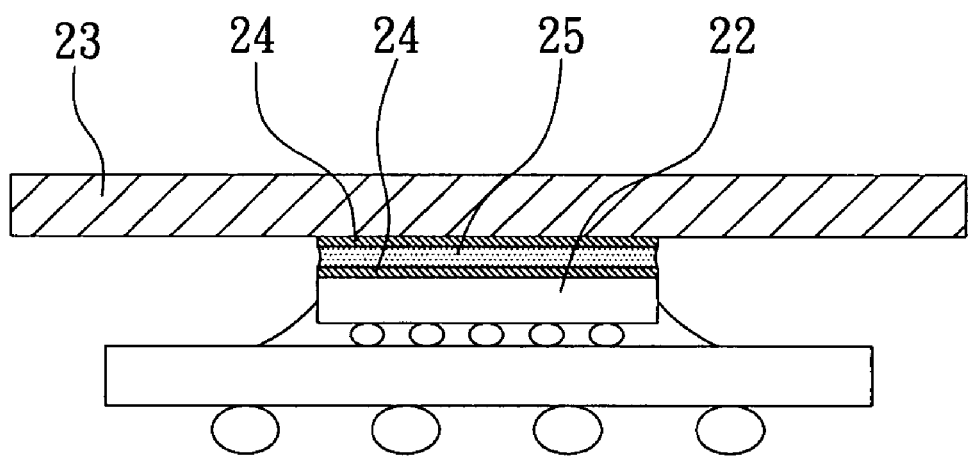
FIG. 2 is a cross-section view showing a flip chip semiconductor package disclosed in U.S. Pat. No. 6,380,621.
Figure 3A:
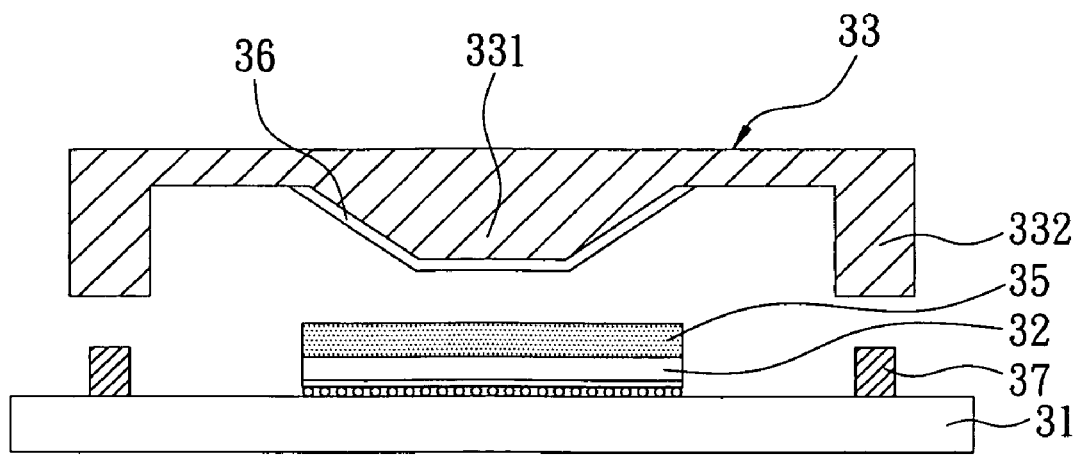
FIGS. 3A and 3B are schematic views showing a flip chip semiconductor package disclosed in U.S. Pat. No. 6,504,723.
Figure 3B:
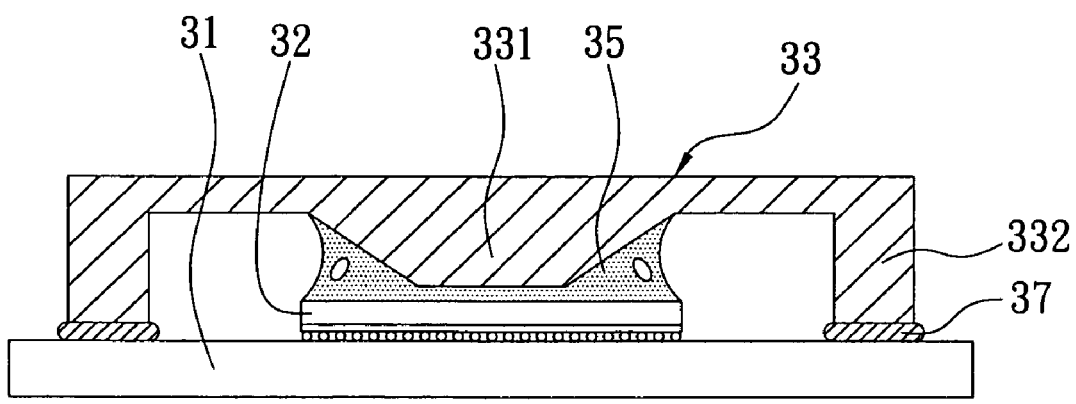
Figure 4:
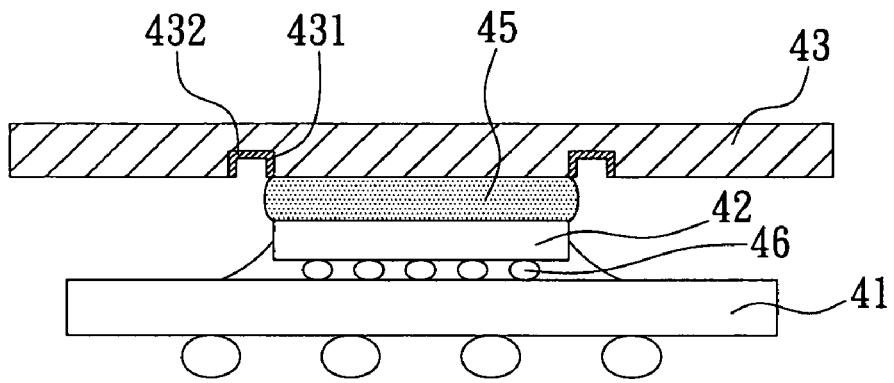
FIG. 4 is a cross-section view showing a heat-dissipating semiconductor package according to the present invention.

Please refer to FIG. 4, showing a heat-dissipating semiconductor package according to the present invention. As shown in FIG. 4, the heat-dissipating semiconductor package includes a chip carrier 41; a flip chip semiconductor chip 42, which is mounted on and electrically connected to the chip carrier 41; a heat sink 43, which is attached to the flip chip semiconductor chip 42, wherein a thermal interface material (TIM) 45 is disposed between the heat sink 43 and the flip chip semiconductor chip 42, a groove 431 is formed on the heat sink 43 around the edge of the bonding area of the thermal interface material 45, and a blocking layer 432 is formed on the surface of the groove 431 to confine the wetting area of the thermal interface material 45.

The chip carrier 41 is, for example a ball grid array (BGA) substrate, which has a first surface and a second surface opposite to each other The flip chip semiconductor chip 42 has an active surface mounted on and electrically connected to the first surface of the substrate, wherein a plurality of conductive bumps 46 are disposed between the active surface of the flip chip semiconductor chip 42 and the first surface of the substrate. A plurality of solder balls are formed on the second surface of the substrate for the flip chip semiconductor chip 42 to be electricity connected to external devices. Certainly, the chip carrier 41 can be a lead frame.

Figure 5:
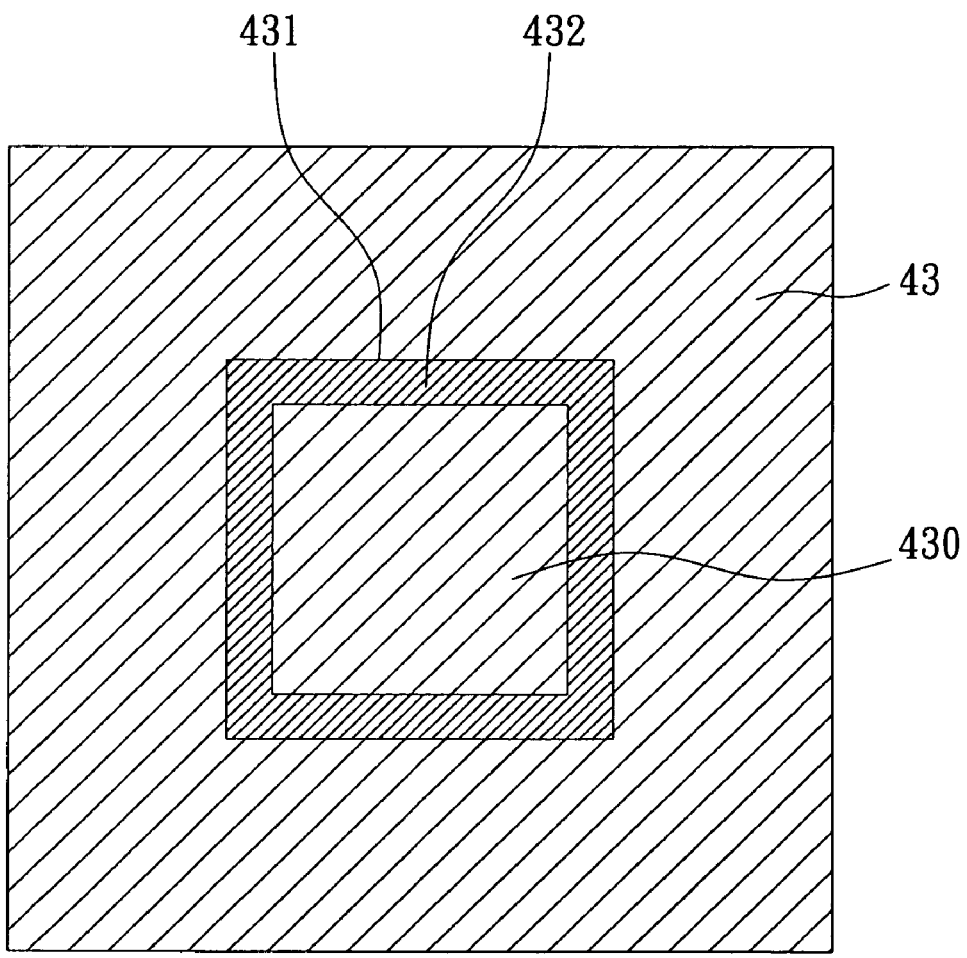
FIG. 5 is a plan view showing a heat-dissipating structure according to the present invention.
Figure 6A:
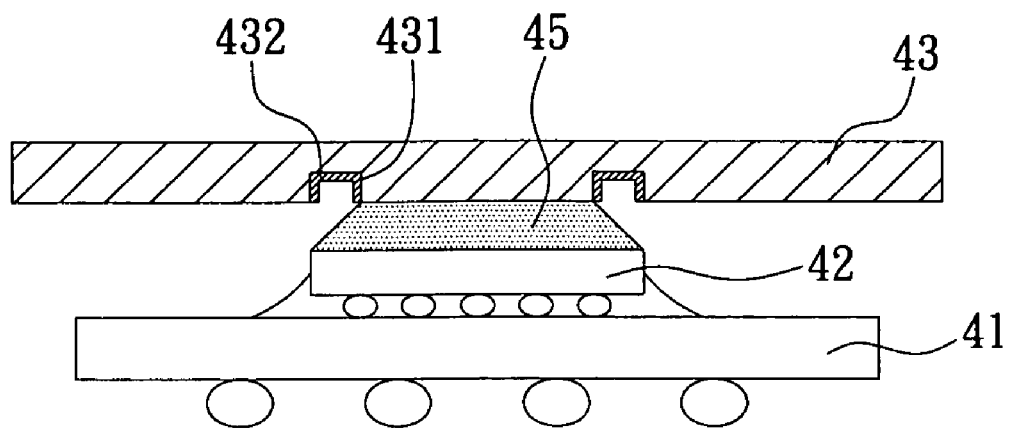
FIGS. 6A and 6B are cross-section views showing different embodiments of heat-dissipating semiconductor packages according to the present invention.
Figure 6B:
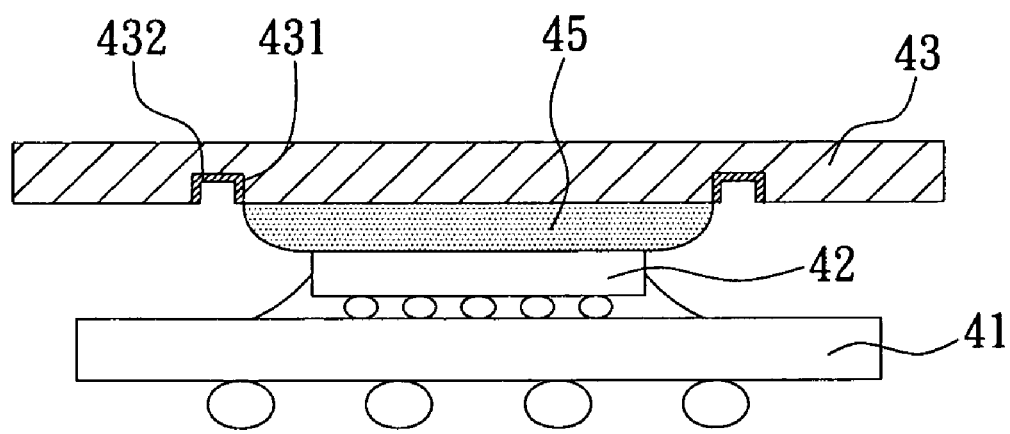

Please refer to FIG. 5, which is a plan showing the heat sink 43. The heat sink 43 has a pre-defined bonding area 430 on its surface, the bonding area 430 is for being bonded to the flip chip semiconductor chip 42, and a thermal interface material 45 is disposed between the heat sink 43 and the flip chip semiconductor chip 42, wherein the area of the bonding area 430 is substantially equal to the area of the semiconductor chip 42, but can also be smaller than or larger than the area of the semiconductor chip, as shown in FIGS. 6A and 6B. A groove 431 is formed around the edge of the bonding area 430.

The heat sink 43 is made of the metallic material, for example copper, the groove 431 can be formed by laser grooving, thus a blocking layer 432, such as a metal oxide layer (e.g. a copper oxide layer), is formed on the surface of the groove 431.

The heat sink 43 is bonded to a non-active surface of the flip chip semiconductor chip 42, a thermal interface material 45, for example a solder material, is disposed between the heat sink 43 and the non-active surface of the flip chip semiconductor chip 42. During the fusion process performed on the thermal interface material 45, since the groove 431 formed on the surface of the heat sink 43 has the blocking layer 432, such as a metal oxide layer, the wetting capability of thermal interface material 45 is lowered, thereby preventing the thermal interface material 45 from wetting onto the groove 431 and ensuring the thermal interface material 45 has sufficient thickness to form solder bonding between the heat sink 43 and the non-active surface of the flip chip semiconductor chip 42, and further ensuring that the heat sink 43 is bonded to the flip chip semiconductor chip 42 effectively.

The present invention also provides a heat-dissipating structure, including a heat sink 43, which has a pre-defined bonding area 430 that is for being bonded to the semiconductor chip 42 via a thermal interface material 45; a groove 431 formed on the heat sink 43 around the edge of the bonding area 430; and a blocking layer 432 formed on the surface of the groove 431, wherein the thermal interface material 45 has low wetting effect on the blocking layer 432. The thermal interface material 45 is, for example a solder material, and the blocking layer 432 is a metal oxide layer, while the groove 431 is formed by laser grooving the heat sink 43 that is made of the metallic material. The area of the bonding area can be equal to, smaller than or larger than the area of the semiconductor chip.

Therefore, the heat-dissipating structure and the heat-dissipating semiconductor package having the same according to the present invention provide a groove on the heat sink around the edge of the bonding area where the heat sink is bonded to the flip chip semiconductor chip, and also provide a metal oxide layer on the surface of the groove, thus in the fusion process performed on the thermal interface material, since the metal oxide layer of the groove formed on the surface of the heat sink reduces the wetting capability of the thermal interface material, the thermal interface material does not wet the groove, thereby ensuring the thermal interface material has sufficient thickness to form solder bonding between the heat sink and the non-active surface of the flip chip semiconductor chip, and further ensuring that the heat sink is bonded to the flip chip semiconductor chip effectively. In addition, the heat-dissipating structure and the heat-dissipating semiconductor package according to the present invention do not need to use the conventional complicated heat dissipation structure and to be preplated with metal layers on the heat sink and the semiconductor chip, thereby saving fabrication time and production cost.

The foregoing descriptions of the detailed embodiments are only illustrated to disclose the features and functions of the present invention and not restrictive of the scope of the present invention. It should be understood to those in the art that, particularly, the choose of the chip carrier, and the application of the electricity connection mode between the chip and the chip carrier, all modifications and variations according to the spirit and principle in the disclosure of the present invention should fall within the scope of the appended claims.

What is claimed is:

1. A heat-dissipating semiconductor package, comprising:
   a chip carrier;
   a semiconductor chip mounted on and electrically connected to the chip carrier; and
   a heat sink bonded to the semiconductor chip via a thermal interface material,
   wherein the heat sink has a groove around an edge of a bonding area of the thermal interface material, a blocking layer is formed on a surface of the groove, the blocking layer is a copper oxide layer, and the thermal interface material has a low wetting effect on the blocking layer to confine a wetting area of the thermal interface material.

2. The heat-dissipating semiconductor package of claim 1, wherein the chip carrier is one of a ball grid array substrate and a lead frame.

3. The heat-dissipating semiconductor package of claim 1, wherein the semiconductor chip has an active surface and a non-active surface, the active surface is mounted on and electrically connected to the chip carrier, a plurality of conductive bumps are positioned between the active surface and the chip carrier, the heat sink is bonded to the non-active surface, and the thermal interface material is positioned between the heat sink and the non-active surface.

4. The heat-dissipating semiconductor package of claim 1, wherein the heat sink is made of a metallic material.

5. The heat-dissipating semiconductor package of claim 4, wherein the heat sink is made of copper.

6. The heat-dissipating semiconductor package of claim 1, wherein the thermal interface material is a solder material.

7. The heat-dissipating semiconductor package of claim 1, wherein the groove is formed by means of laser grooving.

8. The heat-dissipating semiconductor package of claim 1, wherein an area of the bonding area is substantially equal to an area of the semiconductor chip.

9. A heat-dissipating structure, comprising:
   a heat sink having a bonding area to be bonded to a semiconductor chip, wherein a thermal interface material is disposed between the heat sink and the semiconductor chip;
   a groove formed around an edge of the bonding area on the heat sink; and
   a blocking layer formed on a surface of the groove wherein the blocking layer is a copper oxide layer, and the thermal interface material has a low wetting effect on the blocking layer.

10. The heat-dissipating structure of claim 9, wherein the heat sink is made of a metallic material.

11. The heat-dissipating structure of claim 10, wherein the heat sink is made of copper.

12. The heat-dissipating structure of claim 9, wherein the thermal interface material is a solder material.

13. The heat-dissipating structure of claim 9, wherein the groove is formed by laser grooving.

14. The heat-dissipating structure of claim 9, wherein the semiconductor chip has an active surface and a non-active surface, the active surface is mounted on and electrically connected to a chip carrier, a plurality of conductive bumps are positioned between the active surface and the chip carrier, the heat sink is bonded to the non-active surface, and the thermal interface material is positioned between the heat sink and the non-active surface.

15. The heat-dissipating structure of claim 9, wherein an area of the bonding area is substantially equal to an area of the semiconductor chip.

* * * * *